(12) United States Patent  
Oda

(10) Patent No.: US 10,923,901 B2  
(45) Date of Patent: Feb. 16, 2021

(54) PROTECTIVE RELAY DEVICE

(71) Applicant: MITSUBISHI ELECTRIC CORPORATION, Tokyo (JP)

(72) Inventor: Shigetoo Oda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 567 days.

(21) Appl. No.: 15/571,292

(22) PCT Filed: Jun. 12, 2015

(86) PCT No.: PCT/JP2015/067026  
§ 371 (c)(1),  
(2) Date: Nov. 2, 2017

(87) PCT Pub. No.: WO2016/199293  
PCT Pub. Date: Dec. 15, 2016

(65) Prior Publication Data  
US 2018/0278041 A1   Sep. 27, 2018

(51) Int. Cl.  
*H02H 3/00* (2006.01)  
*H02H 9/08* (2006.01)  
(Continued)

(52) U.S. Cl.  
CPC .............. *H02H 3/05* (2013.01); *G01R 15/18* (2013.01); *H02H 1/0007* (2013.01); (Continued)

(58) Field of Classification Search  
CPC .. H02H 3/05; H02H 3/08; H02H 3/28; H02H 1/0007; G01R 15/18  
(Continued)

(56) References Cited

U.S. PATENT DOCUMENTS

| 7,196,884 B2* | 3/2007 | Guzman-Casillas .... H02H 3/28 307/134 |
| 2009/0231769 A1* | 9/2009 | Fischer .................. H02H 3/286 361/87 |

FOREIGN PATENT DOCUMENTS

| JP | H 11-205998 A | 7/1999 |
| JP | 2011-188639 A | 9/2011 |

OTHER PUBLICATIONS

International Search Report (PCT/ISA/210) dated Aug. 11, 2015, by the Japan Patent Office as the International Searching Authority for International Application No. PCT/JP2015/067026.

(Continued)

*Primary Examiner* — Jared Fureman  
*Assistant Examiner* — Lucy M Thomas  
(74) *Attorney, Agent, or Firm* — Buchanan Ingersoll & Rooney PC

(57) ABSTRACT

In a protective relay device, a current differential relay computation unit determines whether or not a fault has occurred within a protected section based on an operating quantity and a restraint quantity. A disconnection detection unit computes a first amount of difference by subtracting the operating quantity a certain time period ago from the operating quantity at a present point in time, computes a second amount of difference by subtracting the restraint quantity the certain time period ago from the restraint quantity at the present point in time, and determines that a disconnection has occurred at one of first and second current transformers when a first determination condition that an absolute value of a sum of the first amount of difference and the second amount of difference is equal to or smaller than a first set value is satisfied.

10 Claims, 9 Drawing Sheets

(51) Int. Cl.
*H02H 3/05* (2006.01)
*H02H 3/04* (2006.01)
*H02H 3/30* (2006.01)
*H02H 3/28* (2006.01)
*G01R 15/18* (2006.01)
*H02H 1/00* (2006.01)
*H02H 3/08* (2006.01)

(52) U.S. Cl.
CPC .............. *H02H 3/044* (2013.01); *H02H 3/08* (2013.01); *H02H 3/28* (2013.01); *H02H 3/305* (2013.01)

(58) Field of Classification Search
USPC .......................................................... 361/42
See application file for complete search history.

(56) References Cited

OTHER PUBLICATIONS

Written Opinion (PCT/ISA/237) dated Aug. 11, 2015, by the Japan Patent Office as the International Searching Authority for International Application No. PCT/JP2015/067026.

* cited by examiner

FIG.3

| | CURRENT VECTOR FLOWING THROUGH P END CT | CURRENT VECTOR FLOWING THROUGH Q END CT |
|---|---|---|
| NORMAL STATE (BEFORE FAULT) | (A) | (B) |
| DURING FAULT | (C) | (D) |

PROTECTIVE RELAY DEVICE

TECHNICAL FIELD

The present disclosure relates to a protective relay device for protecting a power transmission line, electric power equipment and the like by using a current differential relay scheme, and more particularly relates to detecting a disconnection of a secondary-side cable of a current transformer connected to the protective relay device.

BACKGROUND ART

Known methods of detecting a disconnection of a secondary-side cable of a current transformer (CT) used for a current differential relay, without requiring the addition of special hardware or a determination result from another relay element, include the following:

Japanese Patent Laying-Open No. 2011-188639 (PTD 1) discloses a method of detecting a CT disconnection by using a restraint quantity calculated by a current differential relay element. Specifically, CT disconnection detecting means computes an amount of difference between the magnitude of a restraint quantity a certain time period ago and the magnitude of a restraint quantity at the present point in time, and if this amount of difference is equal to or grater than a set value, determines that there is a CT disconnection and blocks output of the current differential relay element. There is also provided means for preventing an erroneous determination by enabling the above-described CT disconnection determination when the restraint quantity at the present point in time is equal to or grater than a prescribed value.

Japanese Patent Laying-Open No. 11-205998 (PTD 2) discloses a method of detecting a CT disconnection by using a detected value of current of each phase, although it is not limited to a current differential relay. Specifically, CT disconnection detecting means determines, when the current of any one of three phases is zero and the current of another phase is greater than a set value, that a CT of the phase of the zero current has been disconnected.

CITATION LIST

Patent Documents

PTD 1: Japanese Patent Laying-Open No. 2011-188639
PTD 2: Japanese Patent Laying-Open No. 11-205998

SUMMARY OF INVENTION

Technical Problem

As a result of studying the above-described known techniques, the present inventor found that the CT disconnection detection methods by the above-described known techniques are unproblematic when a power supply is connected to both ends of a power transmission line to be protected, but are problematic when a power supply is connected to only one end (when the other end is connected to a load with a transformer interposed therebetween). Specifically, upon the occurrence of a single line-to-ground fault in a power transmission line whose one end is not connected to a power supply, there is a possibility that it will be erroneously determined that a CT connected to a sound phase of the power transmission line has been disconnected (the reason for which will be explained in detail in a detailed description of the disclosure).

The present disclosure is made in view of the above problem, and has an object to provide a protective relay device using a current differential relay scheme, in which a CT disconnection can be correctly determined even when one end of a protected section is not connected to a power supply (is connected to a load). The protective relay device according to the disclosure of the present application can be applied not only to a power transmission line, but also to other electric power equipment such as a transformer.

Solution to Problem

A protective relay device according to the present disclosure includes a current differential relay computation unit and a disconnection detection unit. The current differential relay computation unit determines whether or not a fault has occurred within a protected section based on an operating quantity and a restraint quantity, the operating quantity and the restraint quantity having been computed from a first alternating current based on a detected value from a first current transformer provided at a first end of the protected section, and a second alternating current based on a detected value from a second current transformer provided at a second end of the protected section. The disconnection detection unit detects whether or not a disconnection has occurred at the first and second current transformers. The disconnection detection unit includes a first determination unit. The first determination unit computes a first amount of difference by subtracting the operating quantity a certain time period ago from the operating quantity at a present point in time, computes a second amount of difference by subtracting the restraint quantity the certain time period ago from the restraint quantity at the present point in time, and determines whether or not a first determination condition that an absolute value of a sum of the first amount of difference and the second amount of difference is equal to or smaller than a first set value is satisfied. The disconnection detection unit determines that a disconnection has occurred at one of the first and second current transformers when the first determination condition is satisfied.

Advantageous Effects of Invention

According to the present disclosure, it is determined whether or not there is a CT disconnection based on the above-described first determination condition, so that a CT disconnection can be correctly determined even when one end of the protected section is not connected to a power supply (is connected to a load).

BRIEF DESCRIPTION OF DRAWINGS

FIG. 3 shows vector diagrams of a load current and a fault current in each phase of FIG. 2.

DESCRIPTION OF EMBODIMENTS

Embodiments will be described below in detail with reference to the drawings. The same or corresponding parts are designated by the same reference signs and description thereof will not be repeated.

First Embodiment

[Overview of Current Differential Relay]

Figure 1:
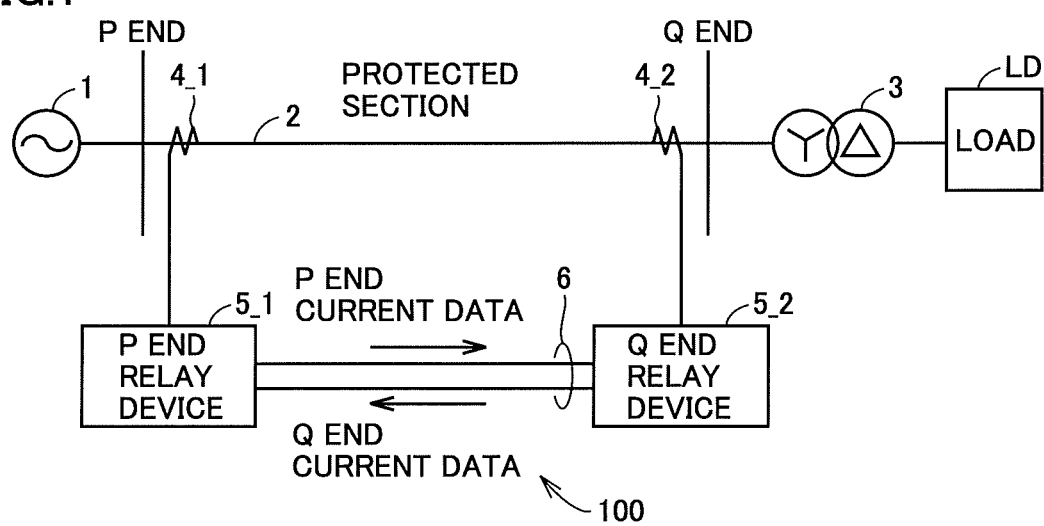
FIG. 1 is a diagram for illustrating a current differential relay for protecting a power transmission line.

FIG. 1 is a diagram for illustrating a current differential relay for protecting a power transmission line. Although it is actually a three-phase alternating current (AC) circuit, the circuit diagram of FIG. 1 is shown as a single line diagram.

Referring to FIG. 1, a three-phase power transmission line 2 has a P end connected to a three-phase power supply (power generator) 1, and a Q end connected to a load LD with a Y-Δ connected transformer 3 interposed therebetween. A neutral point of primary windings (Y connection) of transformer 3 is grounded. A power transmission line protective system 100 using a current differential relay scheme includes current transformers (CTs) 4_1, 4_2 and protective relay devices 5_1, 5_2 provided at the P end and the Q end of power transmission line 2. The portion of the power transmission line between current transformers 4_1 and 4_2 is a protected section.

Protective relay device 5_1 (also referred to as a "P end relay device") is connected to current transformer 4_1, and receives a current at the P end from current transformer 4_1 (i.e., P end alternating current converted by current transformer 4_1). Protective relay device 5_2 (also referred to as a "Q end relay device") is connected to current transformer 4_2, and receives a current at the Q end from current transformer 4_2 (i.e., Q end alternating current converted by current transformer 4_2).

In addition, protective relay devices 5_1 and 5_2 are connected to each other via a communication line 6 (such as a microwave communication line or an optical fiber communication line). Protective relay device 5_1 converts the P end current into digital data, and transmits the converted P end current data to protective relay device 5_2 via communication line 6. Protective relay device 5_2 converts the Q end current into digital data, and transmits the converted Q end current data to protective relay device 5_1 via communication line 6. Each of protective relay devices 5_1 and 5_2 thereby obtains AC data of both the P end and the Q end.

Each of protective relay devices 5_1 and 5_2 determines, based on the P end current data and the Q end current data, whether or not a fault has occurred within the protected section by means of a current differential relay scheme. Specifically, each of protective relay devices 5_1 and 5_2 determines, in accordance with the Kirchhoff's current law, that an internal failure has not occurred when the sum of the P end alternating current and the Q end alternating current is 0 (the polarities of current transformers 4_1 and 4_2 are in opposite directions to each other), and that an internal failure has occurred when the sum of the P end alternating current and the Q end alternating current is not 0. This fault determination is made for each phase of three-phase power transmission line 2. In actuality, a ratio differential relay scheme is used in consideration of an error caused by a fault current in the case of an external failure (which will be described in detail in FIG. 5).

Upon determining that there is an internal failure, protective relay devices 5_1 and 5_2 output an opening signal (actuating signal) to breakers (not shown) provided at the P end and the Q end of power transmission line 2, respectively. The failure section of the power transmission line can thereby be separated from the electric power system.

[Problems in the Case of Single Line-to-Ground Fault]

Problems with the methods disclosed in Japanese Patent Laying-Open No. 2011-188639 (PTD 1) and Japanese Patent Laying-Open No. 11-205998 (PTD 2), which were pointed out in the background art section, will now be described in detail.

Figure 2:
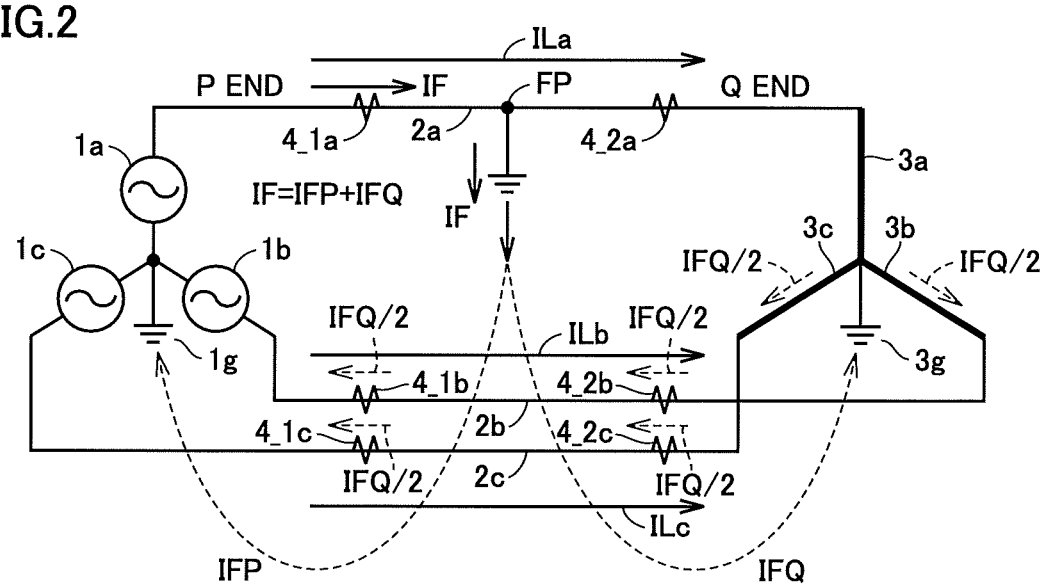
FIG. 2 is a diagram for illustrating a path of a fault current when a ground fault has occurred in an a-phase of the power transmission line of FIG. 1.

FIG. 2 is a diagram for illustrating a path of a fault current when a ground fault has occurred in an a-phase of the power transmission line of FIG. 1. FIG. 3 shows vector diagrams of a load current and a fault current in each phase of FIG. 2.

Referring to FIGS. 2 and 3, power generator 1 is equivalently represented by voltage sources 1a, 1b and 1c of an a-phase, a b-phase and a c-phase. A neutral point of voltage sources 1a, 1b and 1c is connected to a grounding electrode 1g. Power generator 1 is connected to primary windings 3a, 3b and 3c of transformer 3 through power transmission lines 2a, 2b and 2c for the a-phase, the b-phase and the c-phase. A neutral point of Y-connected primary windings 3a, 3b and 3c is connected to a grounding electrode 3g.

In the normal state (before a fault), load currents ILa, ILb and ILc flow through power transmission lines 2a, 2b and 2c, respectively. The vector diagram of FIG. 3 (A) shows the load currents at the P end (detected by current transformers 4_1a, 4_1b and 4_1c for the a-phase, the b-phase and the c-phase, respectively) in the normal state, and the vector diagram of FIG. 3 (B) shows the load currents at the Q end (detected by current transformers 4_2a, 4_2b and 4_2c for the a-phase, the b-phase and the c-phase, respectively) in the normal state. Load LD includes a capacitive component in addition to a resistive component. Thus, load currents ILa, ILb and ILc detected at the P end CT are advanced in phase with respect to three-phase voltages Va, Vb and Vc at the P end. Since the polarity of the Q end CT is opposite to the polarity of the P end CT, load currents ILa, ILb and ILc detected at the Q end CT are reversed (different in phase by 180°) with respect to the P end load currents.

As shown in FIG. 2, when a ground fault occurs in a-phase power transmission line 2 at a fault point FP, a ground fault current IF flows to the ground from fault point FP of a-phase power transmission line 2a. Ground fault current IF that has flown to the ground is branched to grounding electrode 1g at the power supply end (P end) and grounding electrode 3g at the non-power supply end (Q end). Here, the current flowing toward P end grounding electrode 1g is represented as IFP and the current flowing toward Q end grounding electrode 3g is represented as IFQ. Ground fault current IF is represented as IF=IFP+IFQ. Ground fault current IFQ that has been branched to the Q end reaches the neutral point of primary windings (Y connection) 3a, 3b and 3c of transformer 3. From this neutral point, the current is branched to the b-phase and the c-phase which are sound phases of the power transmission line. As a result, a feedback fault current IFQ/2 flows through power transmission lines 2b and 2c for the b-phase and the c-phase, respectively, in a direction from the Q end toward the P end.

The vector diagram of FIG. 3 (C) shows load currents ILa, ILb, ILc, fault current IF, and feedback fault current IFQ/2, which are detected by current transformer 4_1 at the P end during the a-phase ground fault. The vector diagram of FIG. 3 (D) shows load currents ILa, ILb, ILc and feedback fault current IFQ/2, which are detected by current transformer 4_2 at the Q end during the a-phase ground fault. Due to the a-phase ground fault, load current ILa detected at the P end and the Q end is smaller in magnitude than in the normal state.

Fault current IF flowing through a-phase power transmission line 2a is affected by the inductance of a-phase power transmission line 2a, and is thus delayed in phase by about 90° with respect to a-phase voltage Va. A-phase fault current IF is detected by current transformer 4_1a at the P end, but is not detected by current transformer 4_2a at the Q end. Fault current IFQ/2 that is fed back from the Q end to the P end through power transmission lines 2b and 2c for the b-phase and the c-phase is in an opposite direction to fault current IF of the a-phase. Feedback fault current IFQ/2 is detected by all of current transformers 4_1b, 4_1c at the P end and current transformer 4_2b, 4_2c at the Q end.

Here, a current detected by each of current transformers 4_1b and 4_2b for the b-phase is a composite current of load current ILb of the b-phase and fault current IFQ/2 fed back from the Q end to the P end through power transmission line 2b. As shown in FIG. 3 (C) and FIG. 3 (D), load current ILb and feedback fault current IFQ/2 are in opposite directions to each other, and in such a relationship as to cancel each other out. Accordingly, compared to a current (which is equal to load current ILb) detected by each of current transformers 4_1b and 4_2b for the b-phase before the fault, a detected current of the b-phase during the fault decreases in magnitude.

For this reason, if a method of determining that there is a CT disconnection when an amount of difference between a restraint quantity a certain time period ago (the sum of the magnitude of the P end current and the magnitude of the Q end current) and a restraint quantity at the present point in time is equal to or grater than a set value, as disclosed in Japanese Patent Laying-Open No. 2011-188639 (PTD 1), is employed, there is a possibility that it will be erroneously determined that there is a CT disconnection in the b-phase which is a sound phase. Furthermore, if b-phase load current ILb and feedback fault current IFQ/2 do not completely cancel each other out, there is a possibility that the function of preventing an erroneous determination by enabling the above-described CT disconnection determination when the restraint quantity at the present point in time is equal to or grater than a prescribed value will not be enabled. If a ground fault is a transient fault, the P end current and the Q end current after the fault has been removed return to a value equal to the load current, and thus will not be a zero current. Accordingly, the function of preventing an erroneous determination is not enabled even after the fault has been removed.

In addition, if a method of determining, when the current of any one of three phases is zero and the current of another phase is greater than a set value, that a CT of the phase of the zero current has been disconnected, as disclosed in Japanese Patent Laying-Open No. 11-205998 (PTD 2), is employed, there is a possibility that it will be erroneously determined that there is a CT disconnection in the b-phase which is a sound phase. This is because, as described above, during the a-phase ground fault, the b-phase current detected at the P end and the Q end may be substantially a zero current, and the current of another phase may be equal to or greater than a set value.

If a power supply is connected instead of the transformer at the Q end of FIG. 2, fault current IFQ/2 during the a-phase ground fault does not flow into power transmission lines 2b and 2c which are sound phases (because of the impedance of the power supply). Thus, the erroneous determination as described above does not occur even if the CT disconnection determining methods described in PTDs 1 and 2 are employed.

As will be described below, the protective relay devices of the first embodiment provide a method capable of correctly determining a CT disconnection when a power supply is connected to both ends of the protected section, and also when a power supply is connected to only one side of the protected section.

[Hardware Configuration of Protective Relay Device]

Figure 4:
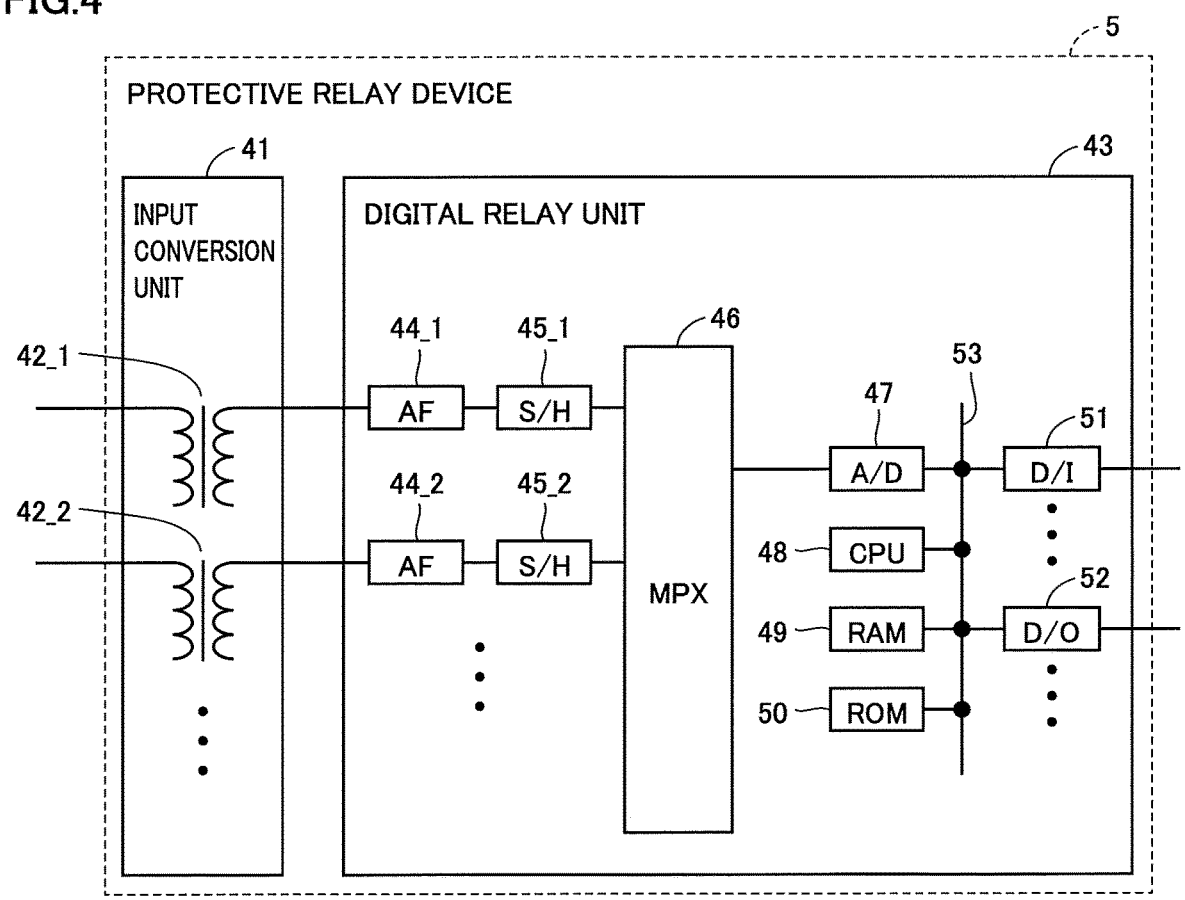
FIG. 4 is a block diagram showing a hardware configuration of a protective relay device of FIG. 1.

FIG. 4 is a block diagram showing a hardware configuration of the protective relay device of FIG. 1. Referring to FIG. 4, a digital protective relay device 5 (5_1 and 5_2 of FIG. 1) includes an input conversion unit 41 having built-in auxiliary transformers 42_1, 42_2, . . . , and a digital relay unit 43.

Input conversion unit 41 is an input unit that receives current signals of a three-phase alternating current obtained for each phase at current transformers 4_1 and 4_2 of FIG. 1. Each auxiliary transformer 42 converts the current signals from current transformers 4_1 and 4_2 into a voltage signal of a voltage level suitable for signal processing at digital relay unit 43.

Digital relay unit 43 includes analog filters (AFs) 44_1, 44_2, . . . , sample hold circuits (S/Hs) 45_1, 45_2, . . . , a multiplexer (MPX) 46, and an analog-to-digital (A/D) converter 47. Digital relay unit 43 further includes a central processing unit (CPU) 48, a random access memory (RAM) 49, a read only memory (ROM) 50, a digital input (D/I) circuit 51, a digital output (D/O) circuit 52, and a bus 53 connecting these components.

Each analog filter 44 is a low-pass filter provided to remove aliasing error during A/D conversion. Each sample hold circuit 45 samples a signal that has passed through a corresponding one of analog filters 44 at a prescribed sampling frequency and holds the signal. Multiplexer 46 successively selects the voltage signals held by sample hold circuits 45_1, 45_2, . . . . A/D converter 47 converts the voltage signal selected by the multiplexor into a digital value. CPU 48 operates in accordance with programs stored in ROM 50 and not-shown external storage devices, and performs computation for various types of protective elements based on the digital data outputted from A/D converter 47. Digital output circuit 52 outputs an opening command for opening the breakers.

[Functional Configuration of Protective Relay Device]

Figure 5:
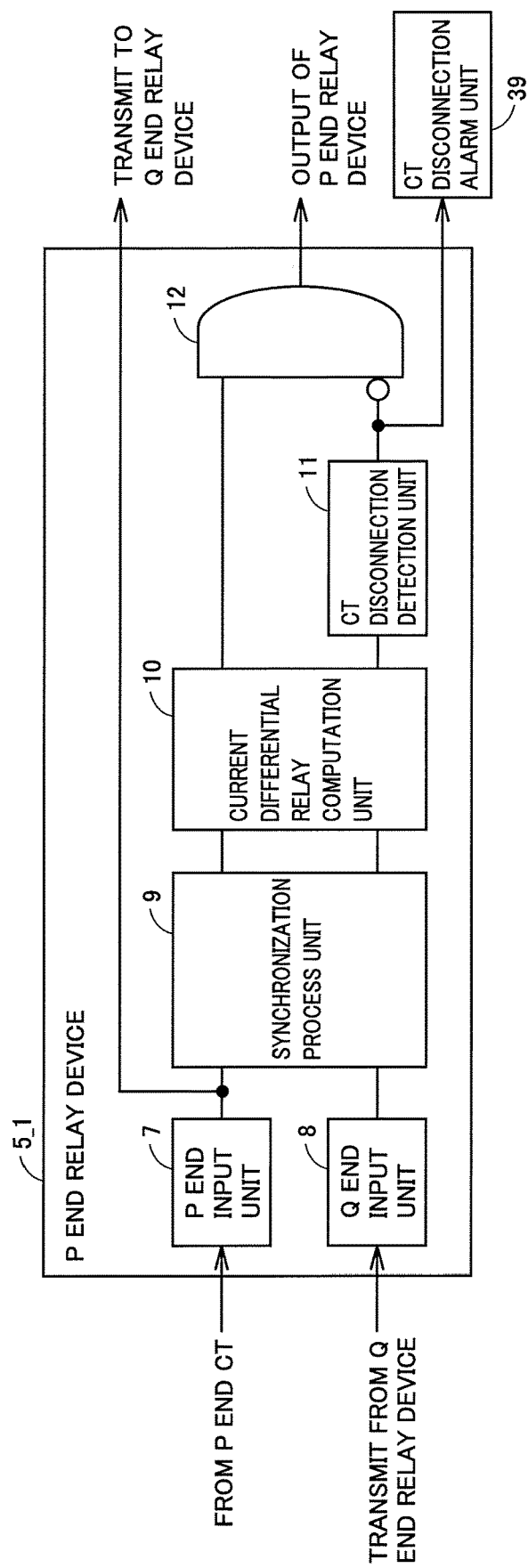
FIG. 5 is a block diagram showing a functional configuration of the protective relay device of FIG. 1.

FIG. 5 is a block diagram showing a functional configuration of the protective relay device of FIG. 1. In FIG. 5, the functional configuration of P end relay device 5_1 of FIG. 1 is representatively explained. The functional configuration of Q end relay device 52 corresponds to the functional configuration of FIG. 5 in which the "P end" and the "Q end" are reversed.

Referring to FIG. 5, functionally speaking, P end relay device 5_1 includes a P end input unit 7, a Q end input unit 8, a synchronization process unit 9, a current differential relay computation unit 10, a CT disconnection detection unit 11, and a logic gate 12. Some of these functions are implemented by dedicated circuits of FIG. 4 (such as A/D converter 47), but most of the functions are implemented by CPU 48 of FIG. 4 executing a program. Of course, some or all of these functions can be implemented by using dedicated circuits instead of the CPU.

P end input unit 7 receives a current signal from current transformer 4_1 at its own end (P end), and digitally converts the inputted P end current signal. P end input unit 7 transmits the converted digital current data to Q end relay device 5_2 via communication line 6 of FIG. 1, and also outputs the data to synchronization process unit 9. P end input unit 7 corresponds to input conversion unit 41, AD converter 47, CPU 48, digital output circuit 52 and the like of FIG. 4.

Q end input unit 8 receives digital current data from a counterpart end (Q end) via communication line 6 of FIG. 1, and outputs the received digital current data to synchronization process unit 9. Q end input unit 8 corresponds to digital input circuit 51, CPU 48 and the like of FIG. 4.

Synchronization process unit 9 causes the digital current data from its own end (P end) to be delayed correspondingly to the delay in transmission of the digital current data from the counterpart end (Q end). The current data at the P end and the current data at the Q end are thereby synchronized (equally timed). The synchronized current data at both ends are inputted to current differential relay computation unit 10. Synchronization process unit 9 corresponds to CPU 48 of FIG. 4.

Current differential relay computation unit 10 determines, based on the synchronized current data at both ends, whether or not a fault has occurred within the protected section of power transmission line 2. Current differential relay computation unit 10 corresponds to CPU 48 of FIG. 4. The contents of relay computation in current differential relay computation unit 10 are now described.

Current differential relay computation unit 10 computes an operating quantity and a restraint quantity for each of the three phases (a-phase, b-phase and c-phase), and determines whether there is a fault for each phase. When the P end alternating current at the present point in time is represented as IP(t) and the Q end alternating current at the present point in time is represented as IQ(t), an operating quantity IOP(t) and a restraint quantity IRE(t) at the present point in time are computed as:

$$IOP(t)=(IP(t)+IQ(t))\text{rms} \quad (1)$$

$$IRE(t)=(IP(0)\text{rms}+(IQ(t))\text{rms} \quad (2)$$

Here, rms indicates an effective value. An amplitude value may be used instead of the effective value.

In the case of an internal fault in the protected section of power transmission line 2, operating quantity IOP(t) increases sharply. In the case of an external fault or in a normal load current condition, operating quantity IOP(t) is substantially zero. A fault determination is thus made possible. However, when a CT error increases because of an increase in current passing through the protected section due to an external fault or the like, an amount corresponding to the error appears in operating quantity IOP(t). In order to prevent unnecessary operation due to such an error, the relay operation is restrained by restraint quantity IRE(t). Generally, when C1 represents a ratio set value and C2 represents a minimum set value, it is determined that there is an internal fault when a condition of $$IOP(t) \geq C1 \times IRE(t) + C2 \quad (3)$$

is satisfied. In this manner, protective relay devices 5_1 and 5_2 of FIG. 1 determine whether there is a fault.

CT disconnection detection unit 11 determines whether there is a disconnection in a secondary-side cable of the CT by using the operating quantity and the restraint quantity computed by current differential relay computation unit 10 as well as current data IP(t) and IQ(t) supplied for those computations, and outputs a determination result to logic gate 12 and a CT disconnection alarm unit 39. Detailed operation of CT disconnection detection unit 11 will be described later with reference to FIG. 6. CT disconnection detection unit 11 corresponds to CPU 48 of FIG. 4.

Logic gate 12 receives a determination result of the internal fault from current differential relay computation unit 10 and a determination result of the CT disconnection from CT disconnection detection unit 11. When it is determined that there is an internal fault (the output of current differential relay computation unit 10 is "1") and that there is no CT disconnection (the output of CT disconnection detection unit 11 is "0"), logic gate 12 outputs an opening command to the breaker at the P end of FIG. 1. Accordingly, when it is determined that there is a CT disconnection by CT disconnection detection unit 11, the output of current differential relay computation unit 10 is blocked. Logic gate 12 corresponds to CPU 48, digital output circuit 52 and the like of FIG. 4.

When it is determined that there is a CT disconnection by CT disconnection detection unit 11, CT disconnection alarm unit 39 issues an alarm by sound, light, screen display or the like.

[Functional Configuration and Operation of CT Disconnection Detection Unit]

Figure 6:
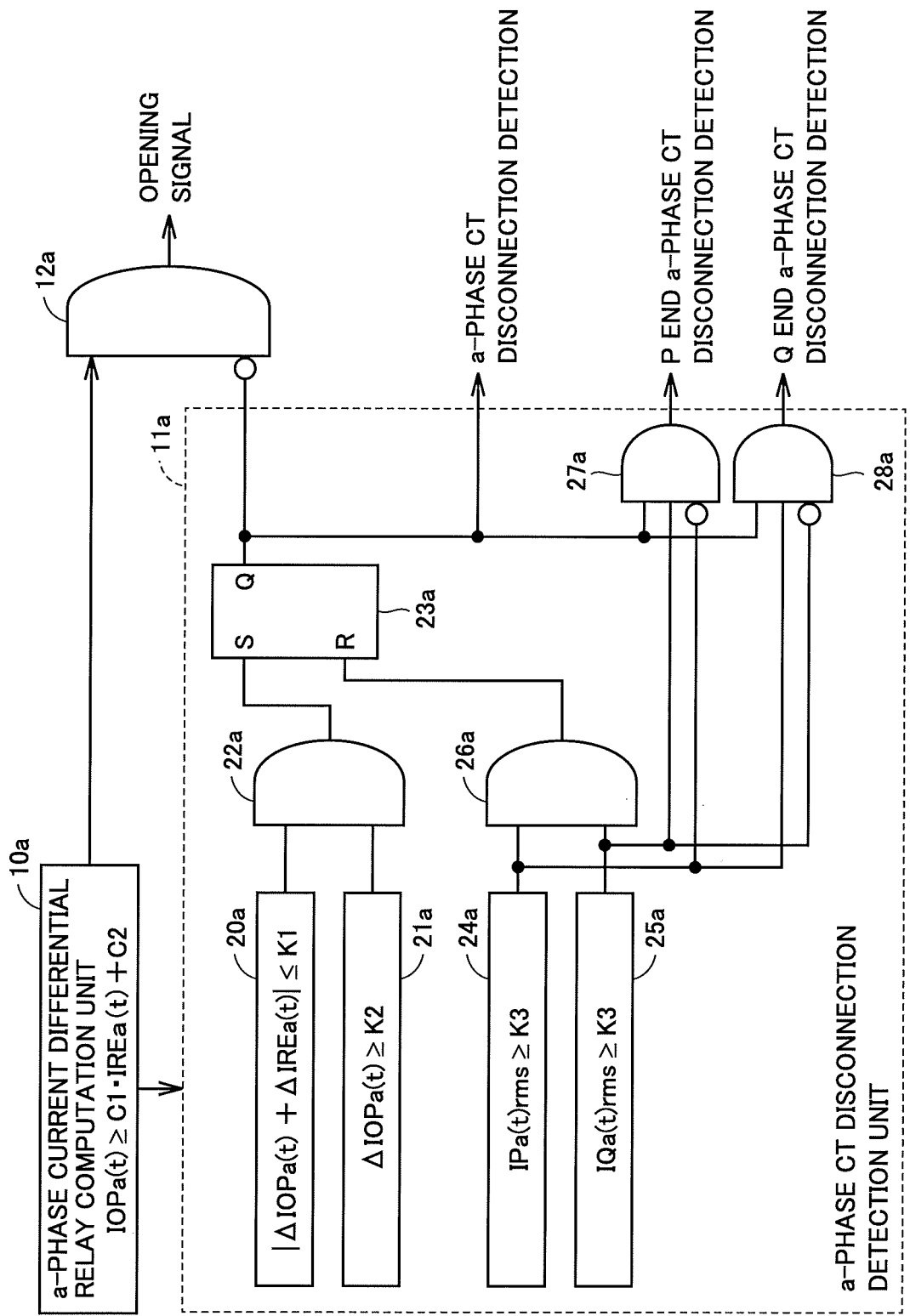
FIG. 6 is a block diagram showing a functional configuration of a CT disconnection detection unit of FIG. 5.

FIG. 6 is a block diagram showing a functional configuration of the CT disconnection detection unit of FIG. 5. The block diagram of FIG. 6 shows a CT disconnection detection unit 11a for the a-phase. CT disconnection detection unit 11a for the a-phase is provided for blocking the output of a corresponding current differential relay computation unit 10a for the a-phase. The CT disconnection detection units for the b-phase and the c-phase operate in a similar manner, and are provided for blocking the outputs of their corresponding current differential relay computation units for the b-phase and the c-phase, respectively. CT disconnection detection unit 11a for the a-phase will be representatively described below.

(1. Overall Configuration)

As shown in FIG. 6, functionally speaking, CT disconnection detection unit 11a for the a-phase includes determination units 20a, 21a, 24a, 25a, logic gates 22a, 26a, 27a, 28a, and an RS flip-flop 23a.

Determination unit 20a receives the operating quantity and the restraint quantity computed by current differential relay computation unit 10a for the a-phase. Determination unit 20a calculates an amount of difference ΔIOP(t) obtained by subtracting an operating quantity IOP(t−T) a certain time period T ago with respect to the present point in time from an operating quantity IOP(t) at the present point in time, and an amount of difference ΔIRE(t) obtained by subtracting a restraint quantity IRE(t−T) certain time period T ago with respect to the present point in time from a restraint quantity IRE(t) at the present point in time. Amounts of difference ΔIOP(t) and ΔIRE(t) are expressed by:

$$\Delta IOP(t)=IOP(t)-IOP(t-T) \quad (4)$$

$$\Delta IRE(t)=IRE(t)-IRE(t-T) \quad (5)$$

Here, certain time period T is usually set to about several cycles to ten-odd cycles. Determination unit 20a computes an absolute value of the sum of these amounts of difference ΔIOP(t) and ΔIRE(t), and activates the output (causes the output to be "1" in the case of FIG. 6) when the computation result is equal to or smaller than a set value K1. The determination condition of determination unit 20a is expressed by:

$$|\Delta IOP(t)+\Delta IRE(t)| \leq K1 \quad (6)$$

Determination unit 21a activates the output (causes the output to be "1" in the case of FIG. 6) when amount of difference ΔIOP(t) in the operating quantity expressed by the above equation (4) is equal to or greater than a set value K2. That is, determination unit 21a determines whether or not a determination condition of $$\Delta IOP(t) \geq K2 \quad (7)$$

is satisfied.

Determination unit 24a activates the output (causes the output to be "1" in the case of FIG. 6) when an effective value IPa(t)rms of the P end current of the a-phase at the present point in time is equal to or greater than a set value K3. An amplitude value may be used instead of the effective value, which applies elsewhere in this specification.

Determination unit 25a activates the output (causes the output to be "1" in the case of FIG. 6) when an effective value IQa(t)rms of the Q end current of the a-phase at the present point in time is equal to or greater than set value K3. An amplitude value may be used instead of the effective value.

Logic gate 22a computes a logical product of the outputs of determination units 20a and 21a, and outputs the computation result to a set terminal S of RS flip-flop 23a. RS flip-flop 23a is placed into a set state upon receiving an input signal at set terminal S (that is, when the input of set terminal S is activated). Since the output of determination unit 20a is activated only temporarily during a disconnection, RS flip-flop 23a is provided to hold the output of logic gate 22a.

The output of RS flip-flop 23a is inputted to a logic gate 12a and to CT disconnection alarm unit 39 of FIG. 5. When both outputs of determination units 20a and 21a are activated, it is determined that there is a CT disconnection, and the output of RS flip-flop 23a is activated. When it is determined that there is a CT disconnection, the operation of the current differential relay computation unit for the a-phase is blocked by logic gate 12a. Since determination unit 21a is provided to prevent unnecessary operation when the load current is relatively small as will be described later, it can be basically considered that it is determined that there is a CT disconnection when the output of determination unit 20a is activated.

Logic gate 26a computes a logical product of the outputs of determination units 24a and 25a, and outputs the computation result to a reset terminal R of RS flip-flop 23a. RS flip-flop 23a is reset when the output of logic gate 26a is activated. CT disconnection detection unit 11a for the a-phase thereby returns to the normal state.

Logic gates 27a and 28a are provided to determine, when it is determined that there is a CT disconnection, whether it is a CT disconnection at the P end or a CT disconnection at the Q end. When the output of flip-flop 23a is activated, the output of determination unit 25a is activated, and the output of determination unit 24a is deactivated (that is, upon determination that there is a CT disconnection, when the effective value or the amplitude value of the a-phase P end alternating current is smaller than set value K3, and the effective value or the amplitude value of the a-phase Q end alternating current is equal to or greater than set value K3), logic gate 27a determines that the CT disconnection has occurred at the P end of the a-phase transmission line. When the output of flip-flop 23a is activated, the output of determination unit 24a is activated, and the output of determination unit 25a is deactivated (that is, upon determination that there is a CT disconnection, when the effective value or the amplitude value of the a-phase P end alternating current is equal to or greater than set value K3, and the effective value or the amplitude value of the a-phase Q end alternating current is smaller than set value K3), logic gate 28a determines that the CT disconnection has occurred at the Q end of the a-phase transmission line. Operations of CT disconnection detection unit 11a in specific examples will be described below.

(2. Operation During Internal Fault of Power Transmission Line)

First, the operation of CT disconnection detection unit 11a in the case of an internal fault of the power transmission line is described. Immediately after the occurrence of an internal fault in power transmission line 2, the present point in time is during the fault, and the certain time period ago (time period T ago) is before the occurrence of the fault. The P end alternating current and the Q end alternating current the certain time period ago (before the occurrence of the fault) are equal to load current IL. Load current IL flows through P end CT 4_1 and Q end CT 4_2, as was described in FIG. 2.

A P end fault current and a Q end fault current during the occurrence of the fault are represented as IF1 and IF2, respectively. Fault current IF1 is a current flowing from the P end power supply toward fault point FP, and fault current IF2 is a current flowing from the Q end power supply toward fault point FP. When a power supply is not connected to the Q end as shown in FIG. 2, fault current IF2 reaches zero. In addition, the load current during the fault is represented as ILf. Since the CTs at both ends are connected so as to have opposite polarities to each other, the operating quantity reaches 0 when a current flows through the protected section as in the case of an external fault or a load current.

As such, based on the above equations (1) and (2), the following relational equations are obtained:

$$IOP(t)=(IF1+IF2)\text{rms} \quad (8)$$

$$IRE(t)=(ILf+IF1)\text{rms}+(ILf+IF2)\text{rms} \quad (9)$$

$$IOP(t-T)=(IL-IL)\text{rms}=0 \quad (10)$$

$$IRE(t-T)=IL\text{rms}+ILL\text{ms}=2\times IL\text{rms} \quad (11)$$

By substituting the above equations (8) to (11) in the above equations (4) and (5), the following relational equations are obtained:

$$\Delta IOP(t) = IOP(t) - IOP(t-T) = (IF1+IF2)\text{rms} \quad (12)$$

$$\Delta IRE(t) = IRE(t) - IRE(t-T) \quad (13)$$
$$= (ILf+IF1)\text{rms} + (ILf+IF2)\text{rms} - 2\times IL\text{rms}$$

Usually, in an electric power system having a power supply at both ends, where the power supply is connected to both the P end and the Q end of power transmission line 2, both the magnitude of fault current IF1 from the P end and the magnitude of fault current IF2 from the Q end are greater than the magnitude of load current ILrms. Even in an electric power system having a power supply at one end, where the power supply is connected to only the P end of power transmission line 2, the magnitude of fault current IF1 from the power supply end (P end) is greater than the magnitude of load current ILrms. Accordingly, ΔIRE(t)>0 holds from the above equation (13). In addition, ΔIOP(t)>0 also holds, so that ΔIOP(t)+ΔIRE(t) is greater than set value K1. Thus, the determination condition for a CT disconnection of the above equation (6) does not hold.

(3. Operation During CT Disconnection at P End)

Next, the operation of CT disconnection detection unit 11a immediately after the occurrence of a CT disconnection at P end CT 4_1 is described. Immediately after the occurrence of the CT disconnection at the P end, the present point in time is during the CT disconnection, and the certain time period ago (time period T ago) is before the CT disconnection. Accordingly, the effective value of the P end alternating current and the Q end alternating current before the CT disconnection is IPa(t−T)rms=IQa(t−T)rms=ILrms (effective value of load current IL). Effective value IPa(t)rms of the P end alternating current is detected as 0, and effective value IQa(t)rms of the Q end alternating current is ILrms, during the CT disconnection at the P end.

Accordingly, based on the above equations (1) and (2), the following relational equations are obtained:

$$IOP(t)=(0+IL)rms=ILrms \qquad (14)$$

$$IRE(t)=0+ILrms=ILrms \qquad (15)$$

$$IOP(t-T)=(IL-IL)rms=0 \qquad (16)$$

$$IRE(t-T)=ILrms+ILrms=2 \times ILrms \qquad (17)$$

By substituting the above equations (14) to (17) in the above equations (4) and (5), the following relational equations are obtained:

$$\Delta IOP(t)=IOP(t)-IOP(t-T)=ILrms \qquad (18)$$

$$\Delta IRE(t)=IRE(t)-IRE(t-T)=-ILrms \qquad (19)$$

Accordingly, ΔIOP(t)+ΔIRE(t)=0 holds, and therefore, the determination condition of determination unit 20a expressed by the above equation (6) holds. Furthermore, ΔIOP(t)=Irms≥K2>0 holds from the above equation (18), and therefore, the determination condition of determination unit 21a expressed by the above equation (7) holds. It can thus be determined that there is a CT disconnection. In order to prevent unnecessary output when load current ILrms is small, it is determined that there is a CT disconnection not when only the determination condition of the above equation (6) holds, but when both determination conditions of the above equations (6) and (7) hold.

(4. Operation Upon Removal of a-Phase Ground Fault)

Next, the operation of CT disconnection detection unit 11a when the a-phase ground fault of power transmission line 2 has been removed is described. Immediately after power transmission line 2 returns from the ground fault, the present point in time is the normal state (a state in which load current IL flows through both ends), and the certain time period ago (time period T ago) is during the fault. Accordingly, amounts of difference ΔIOP(t) and ΔIRE(t) are expressed by the above-described equations (12) and (13) but with reversed signs, respectively, and are both negative values. Accordingly, neither the determination condition (6) of determination unit 20a nor the determination condition (7) of determination unit 21a holds. In this manner, an unnecessary determination by CT disconnection detection unit 11 when the fault has been removed can be prevented by the determination conditions (6) and (7).

(5. Determination Operation for Sound Phase During Single Line-to-Ground Fault)

Determination operation for a sound phase during a single line-to-ground fault when a power supply is not connected to the Q end is described. For the sound phase, operating quantity IOP(t) at the present point in time (during the fault) is 0. This is because feedback fault current IFQ/2 in FIG. 2 is a current passing through power transmission line 2 in a direction from the Q end toward the P end. Accordingly, ΔIOP(t)=0 holds from the equations (4) and (10). Thus, the determination condition of determination unit 21a expressed by the equation (7) does not hold.

On the other hand, feedback fault current IFQ/2 and load current IL may cancel each other out as described in FIG. 2, in which case restraint quantity IRE(t) of the sound phase at the present point in time may reach 0. Accordingly, ΔIRE(t)=−2× ILrms holds from the equations (5) and (11). Thus, |ΔIOP(t)+ΔIRE(t)|=2× ILrms holds, so that the determination condition of determination unit 20a expressed by the equation (6) does not hold. As such, it can be understood that the described problems of the conventional techniques do not occur in the protective relay device of the present embodiment.

(6. Other Considerations)

As set value K1 for the determination condition of determination unit 20a, a value smaller than a minimum value of the operating quantity within which current differential relay computation unit 10 operates is used in order to reliably block the operation of current differential relay computation unit 10 during a CT disconnection. As set value K2 for the determination condition of determination unit 21a, the same value as set value K1 may be selected.

When additional certain time period T has passed since the present point in time, both the present point in time and time period T ago are now a fault state, or both the present point in time and time period T ago are now a CT disconnected state, so that the determination condition (6) of determination unit 20a no longer holds. Accordingly, RS flip-flop 23a shown in FIG. 6 is provided so as to latch and hold the state in which the CT disconnection was detected. As a condition for canceling the CT disconnection detection, a determination condition of determination unit 24a and 25a that a current is flowing through both ends of the protected section is used. That is, when $$IPa(t)rms \geq K3 \text{ and } IQa(t)rms \geq K3 \qquad (20)$$

hold, a reset input is provided to RS flip-flop 23a. It is recommended that set value K3, which is set for detecting the presence or absence of a current, be set to have the highest sensitivity (to the smallest value) possible so as to avoid unnecessary detection.

[Effects]

In this manner, the CT disconnection detection circuit of the protective relay device according to the first embodiment is configured to determine that there is a CT disconnection when the absolute value of the sum of the amount of difference in the operating quantity (difference between the present point in time and the certain time period ago) and the amount of difference in the restraint quantity is equal to or smaller than set value K1, and when the amount of difference in the operating quantity is equal to or greater than set value K2. This allows a CT disconnection and a line fault to be distinguished from each other, and allows a CT disconnection to be correctly detected even when a power supply is connected to only one end of the power transmission line.

Furthermore, by adding the determination of whether or not the current effective value of one of its own end and the counterpart end exceeds set value K3, to the determination result of a CT disconnection described above, it can be determined which one of its own end and the counterpart end includes the occurring CT disconnection.

[Variation]

Instead of the determination condition of determination unit 21a expressed by the equation (7), $$\Delta IRE(t) < -K2 \qquad (21)$$

may be used. During a CT disconnection, $\Delta IOP(t) + \Delta IRE(t) = 0$ ideally holds. Thus, the equation (7) of $\Delta IOP(t) \geq K2$ can be changed to the above equation (21).

Second Embodiment

In the first embodiment, it is determined whether or not a CT disconnection has occurred based on the first determination condition (equation (6)) that the absolute value of the sum of amount of difference $\Delta IOP(t)$ in the operating quantity and amount of difference $\Delta IRE(t)$ in the restraint quantity is equal to or smaller than set value K1, and the second determination condition (equation (7)) that amount of difference $\Delta IOP(t)$ in the operating quantity is equal to or greater than set value K2. In a second embodiment, when the amount of difference in the operating quantity is equal to or greater than a set value K4 (set value K4 corresponds in magnitude to a fault current, and is greater than set value K2), a CT disconnection determination based on the first determination condition and the second determination condition described above is blocked. According to this configuration, it can be determined that there is no CT disconnection for an operating quantity caused by a fault current greater than the load current, thus allowing more reliable CT disconnection detection to be performed. A detailed description is given below with reference to a drawing.

Figure 7:
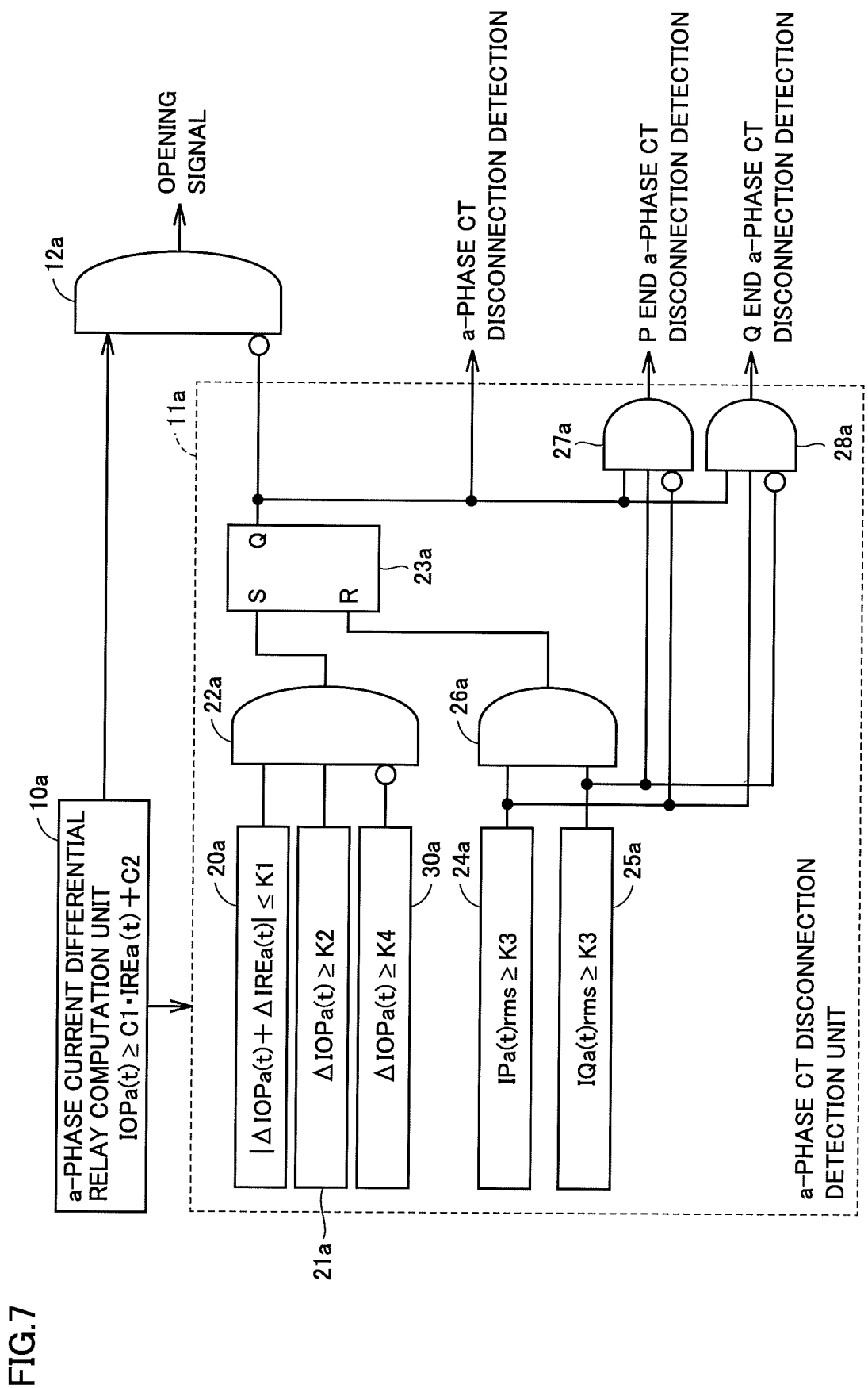
FIG. 7 is a block diagram showing a functional configuration of a CT disconnection detection unit in a protective relay device of a second embodiment.

FIG. 7 is a block diagram showing a functional configuration of a CT disconnection detection unit in a protective relay device of the second embodiment. CT disconnection detection unit 11a of FIG. 7 is different from CT disconnection detection unit 11a of FIG. 6 in that it further includes a determination unit 30a. When amount of difference $\Delta IOP(t)$ in the operating quantity is equal to or greater than set value K4, determination unit 30a causes the output of logic gate 22a to be deactivated even when the outputs of determination units 20a and 21a are activated. That is, the CT disconnection detection is enabled when amount of difference $\Delta IOP(t)$ in the operating quantity is smaller than set value K4.

Set value K4 is set to be greater than a maximum value of the load current. As indicated in the equation (14), IOP(t) becomes equal to, and never exceeds, load current ILrms, during a CT disconnection. Thus, by adding the determination condition of determination unit 30a described above, unnecessary detection of a CT disconnection caused by unexpected current variation during a fault can be prevented.

Since determination unit 30a is only required to determine the occurrence of a fault current exceeding the load current, it is not necessarily required to determine that amount of difference $\Delta IOP(t)$ in the operating quantity is equal to or greater than set value K4. Accordingly, instead of the determination described above, determination unit 30a may simply determine that operating quantity IOP(t) is equal to or greater than set value K4, or that the effective value or the amplitude value of P end current IPa(t) is equal to or greater than set value K4, or that the effective value or the amplitude value of Q end current IQa(t) is equal to or greater than set value K4.

In this manner, the protective relay device of the second embodiment determines that there is a line fault when the operating quantity, or the amount of difference in the operating quantity, or the current effective value at the P end or the Q end is equal to or greater than set value K4, to block the CT disconnection determination by the method described in the first embodiment. As a result, the reliability of the CT disconnection determination can be improved.

Third Embodiment

In the first embodiment, it is determined whether or not a CT disconnection has occurred based on the first determination condition (equation (6)) that the absolute value of the sum of amount of difference $\Delta IOP(t)$ in the operating quantity and amount of difference $\Delta IRE(t)$ in the restraint quantity is equal to or smaller than set value K1, and the second determination condition (equation (7)) that amount of difference $\Delta IOP(t)$ in the operating quantity is equal to or greater than set value K2. In a third embodiment, a third determination condition that one of the effective value of the current at its own end (for example, IPa(t)rms) and the effective value of the current at the counterpart end (for example, IQa(t)rms) is equal to or greater than set value K3, and the other is smaller than set value K3, is added to the determination conditions for a CT disconnection (amplitude values may be used instead of the effective values). In the case of a CT disconnection, only one of the currents at both ends reaches zero (the possibility of the CTs at both ends being simultaneously disconnected is extremely low). Thus, the reliability of the CT disconnection determination can be further improved. A detailed description is given below with reference to a drawing.

Figure 8:
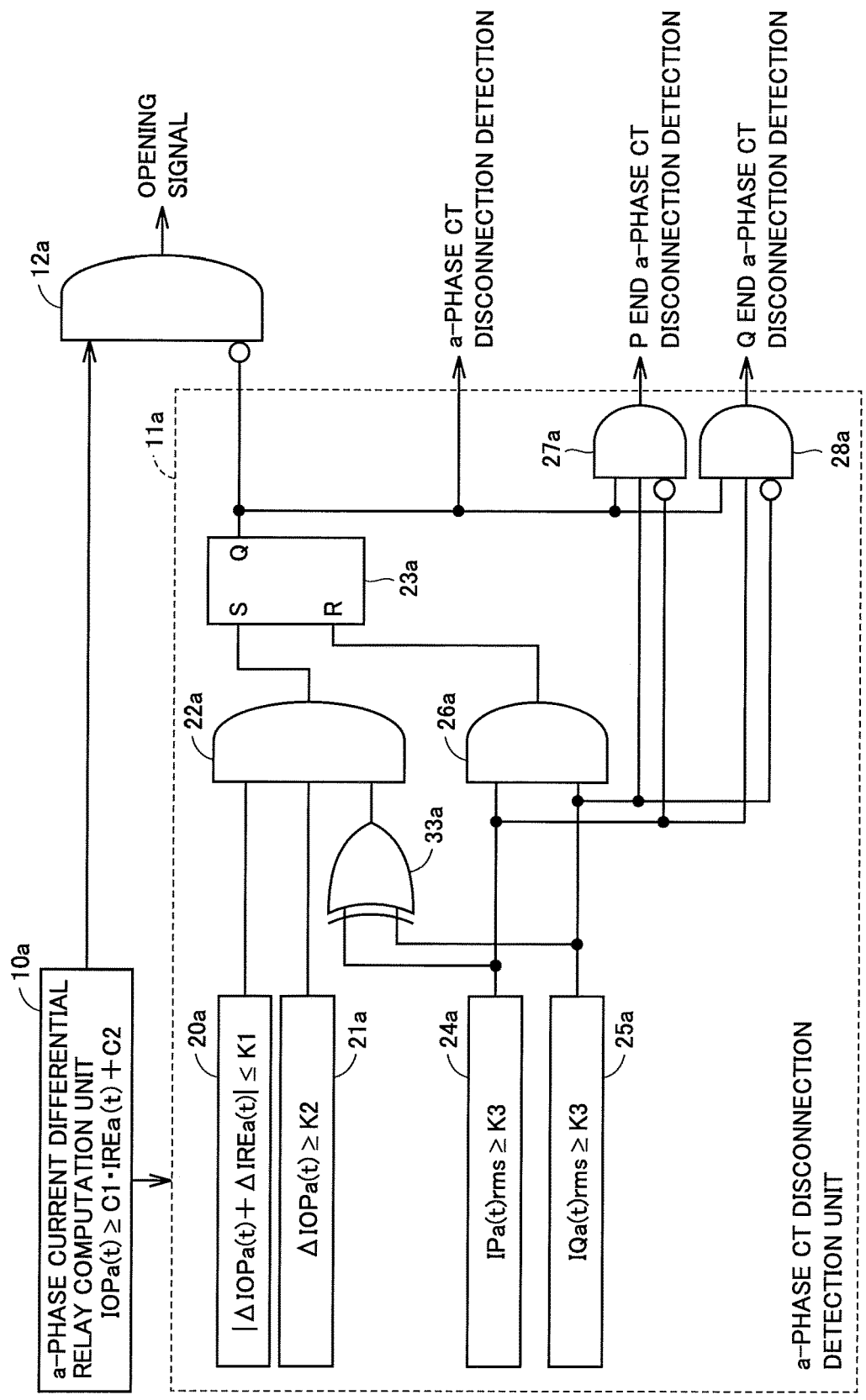
FIG. 8 is a block diagram showing a functional configuration of a CT disconnection detection unit in a protective relay device of a third embodiment.

FIG. 8 is a block diagram showing a functional configuration of a CT disconnection detection unit in a protective relay device of the third embodiment. CT disconnection detection unit 11a of FIG. 8 is different from CT disconnection detection unit 11a of FIG. 6 in that it further includes a logic gate 33a. Logic gate 33a computes an exclusive logical sum of the output of determination unit 24a and the output of determination unit 25a, and outputs the computation result to logic gate 22a. When all of the output of determination unit 20a, the output of determination unit 21a, and the output of logic gate 33a are active (the outputs are "1" in the case of FIG. 8), logic gate 22a outputs a set signal for placing RS flip-flop 23a into a set state. It is thereby possible to determine that there is a CT disconnection only when the CT detects that a current is flowing through only one of both ends.

Generally, when the load current is flowing through power transmission line 2, a current detected value reaches 0 at only one of the P end and the Q end in which a CT disconnection has occurred. In the protective relay device of the third embodiment, it is not determined that there is a CT disconnection when both the P end current and the Q end current are detected, or when neither of them is detected, thus increasing the reliability of the CT disconnection determination.

Fourth Embodiment

In the first embodiment, when CT disconnection detection unit 11a detects a CT disconnection, that detection result is latched by RS flip-flop 23a. Then, RS flip-flop 23a returns from the latched state when the currents at both ends of power transmission line 2 are equal to or greater than set value K3. A fourth embodiment is characterized in that, as a variation of the condition for return from the latched state, it includes a condition for return that the effective value or the amplitude value of current IPa(t) at its own end (P end, for example) is equal to or greater than set value K3 and an operating quantity IOPa(t) at its own end (P end) is smaller than set value K3, thereby eliminating the need for a determination by the current at the counterpart end (Q end). A detailed description is given below with reference to a drawing.

Figure 9:
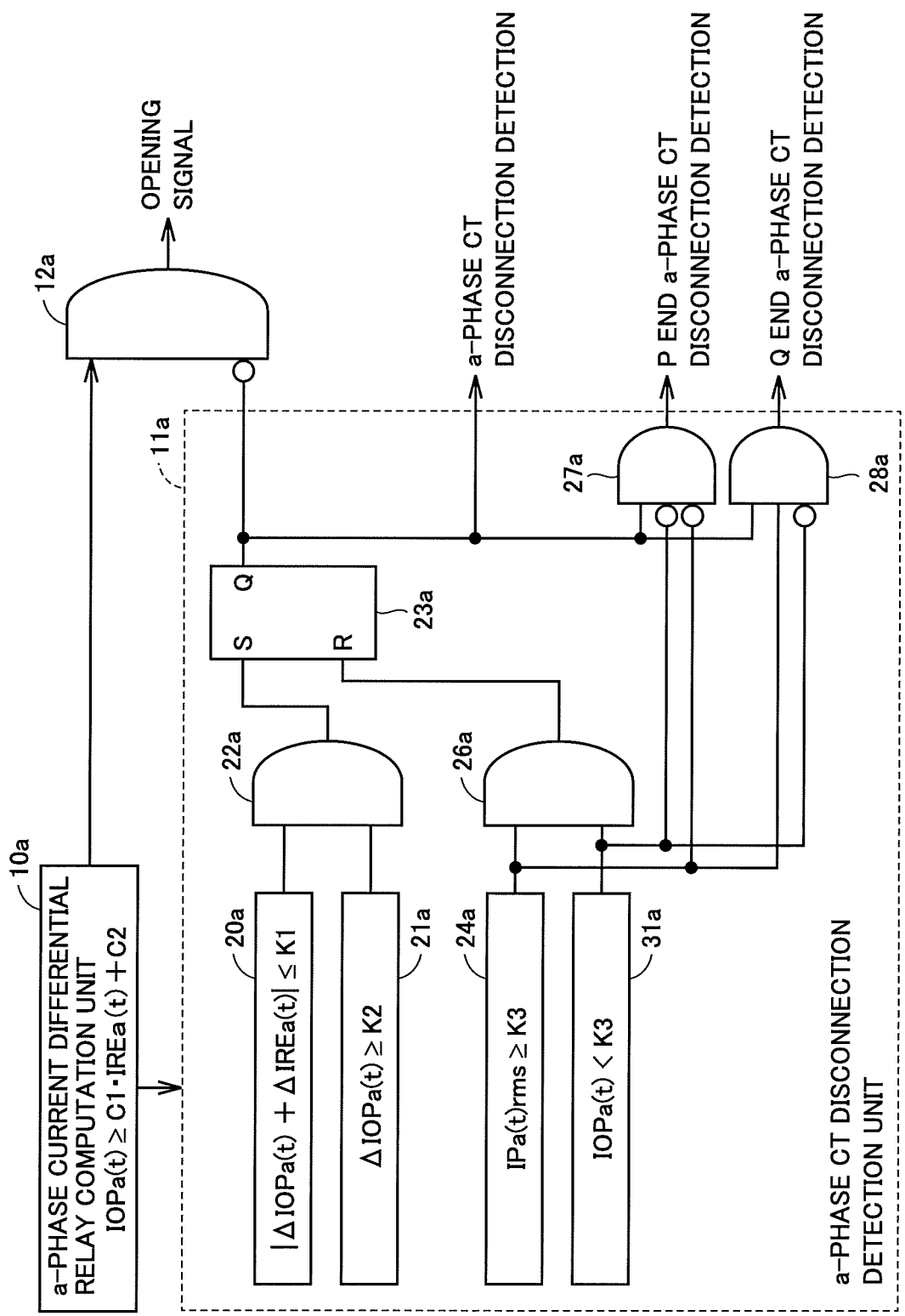
FIG. 9 is a block diagram showing a functional configuration of a CT disconnection detection unit in a protective relay device of a fourth embodiment.

FIG. 9 is a block diagram showing a functional configuration of a CT disconnection detection unit in a protective relay device of the fourth embodiment. CT disconnection detection unit 11a of FIG. 9 is different from CT disconnection detection unit 11a of FIG. 6 in that it includes a determination unit 31a instead of determination unit 25a. Determination unit 31a determines whether or not operating quantity IOPa(t) is smaller than set value K3. A determination result from determination unit 31a is directly inputted to logic gate 26a without being inverted in its logic level, and is inputted to logic gates 27a and 28a while being inverted in its logic level.

When a CT disconnection occurs at its own end (P end), the current at its own end is 0 and the current at the counterpart end (Q end) is equal to or greater than set value K3, and therefore, the operating quantity is equal to or greater than set value K3. On the other hand, when the CT disconnection at its own end (P end) is removed, the current at its own end (P end) becomes equal to or greater than set value K3 and the operating quantity becomes smaller than set value K3, and therefore, that condition is used as a condition for removing the latched state. Specifically, in the case of FIG. 9, determination unit 24a activates the output (causes the output to be "1") when effective value IPa(t)rms of the P end current is equal to or greater than set value K3, and determination unit 31a activates the output (causes the output to be "1") when operating quantity IOPa(t) at the P end is smaller than set value K3. Logic gate 26a inputs a logical sum of the output of determination unit 24a and the output of determination unit 31a to the reset terminal (R) of flip-flop 23a.

Logic gates 27a and 28a are provided to determine which one of its own end (P end) and the counterpart end (Q end) includes the occurring CT disconnection. When a CT disconnection occurs at its own end (P end), the effective value or the amplitude value of the P end current becomes smaller than set value K3 (the output of determination unit 24a is deactivated), and the operating quantity at the P end becomes equal to or greater than set value K3 (the output of determination unit 31a is deactivated). It is determined by logic gate 27a whether or not these conditions are satisfied. Specifically, logic gate 27a computes a logical sum of an output signal of flip-flop 23a, a signal inverted in logic level with respect to an output signal of determination unit 24a, and a signal inverted in logic level with respect to an output signal of determination unit 31a. When the computation result is at high level ("1"), it means that the CT disconnection has occurred at the P end.

On the other hand, when a CT disconnection occurs at the counterpart end (Q end), the effective value or the amplitude value of the P end current becomes equal to or greater than set value K3 (the output of determination unit 24a is activated), and the operating quantity at the P end becomes equal to or greater than set value K3 (the output of determination unit 31a is deactivated). It is determined by a logic gate 32a whether or not these conditions are satisfied. Specifically, logic gate 32a computes a logical sum of an output signal of flip-flop 23a, an output signal of determination unit 24a, and a signal inverted in logic level with respect to an output signal of determination unit 31a. When the computation result is at high level ("1"), it means that the CT disconnection has occurred at the Q end.

It should be understood that the embodiments disclosed herein are illustrative and non-restrictive in every respect. For example, although a current differential relay that protects a power transmission line has been described above, the determination conditions for a CT disconnection described above can be applied not only to the power transmission line, but also when protecting electric power equipment such as a transformer by a ratio differential relay using an operating quantity and a restraint quantity. The scope of the present invention is defined by the terms of the claims, rather than the description above, and is intended to include any modifications within the scope and meaning equivalent to the terms of the claims.

REFERENCE SIGNS LIST 2 power transmission line; 3 transformer; 4 current transformer; 5 protective relay device; 6 communication line; 10, 10a current differential relay computation unit; 11, 11a CT disconnection detection unit; 20a, 21a, 24a, 25a, 30a, 31a determination unit; 23a flip-flop; FP fault point; IF ground fault current; IOP operating quantity; IP P end current data; IQ Q end current data; IRE restraint quantity; K1, K2, K3, K4 set value; T certain time period.

The invention claimed is:
1. A protective relay device comprising:
a current differential relay computation unit configured to determine whether or not a fault has occurred within a protected section based on an operating quantity at a present point in time and a restraint quantity at the present point in time, the operating quantity at the present point in time being an amplitude or effective value of a sum of a first alternating current at the present point in time and a second alternating current at the present point in time, the restraint quantity at the present point in time being a sum of an amplitude or effective value of the first alternating current at the present point in time and an amplitude or effective value of the second alternating current at the present point in time, the first alternating current being based on a detected value from a first current transformer provided at a first end of the protected section, and the second alternating current being based on a detected value from a second current transformer provided at a second end of the protected section; and
a disconnection detection unit configured to detect whether or not a disconnection has occurred at the first and second current transformers,
the disconnection detection unit including a first determination unit, the first determination unit being configured to compute a first amount of difference by subtracting the operating quantity at a prior point in time preceding the present point in time from the operating quantity at the present point in time, compute a second amount of difference by subtracting the restraint quantity at the prior point in time from the restraint quantity at the present point in time, the operating quantity at the prior point in time being an amplitude or effective value of a sum of the first alternating current at the prior point in time and the second alternating current at the prior point in time, the restraint quantity at the prior point in time being a sum of an amplitude or effective value of the first alternating current at the prior point in time and an amplitude or effective value of the second alternating current at the prior point in time, the first determination unit being configured to determine whether or not a first determination condition that an absolute value of a sum of the first amount of difference and the second amount of difference is equal to or smaller than a first set value is satisfied, the disconnection detection unit determining that a disconnection has occurred at one of the first and second current transformers when the first determination condition is satisfied.

2. The protective relay device according to claim 1, wherein the disconnection detection unit further includes a second determination unit configured to determine whether or not a second determination condition that the first amount of difference is equal to or greater than a second set value is satisfied, and the disconnection detection unit determines that a disconnection has occurred at one of the first and second current transformers when both the first and second determination conditions are satisfied.

3. The protective relay device according to claim 1, wherein the disconnection detection unit includes a further determination unit configured to determine whether or not a further determination condition that the second amount of difference is smaller than a further set value is satisfied, and the disconnection detection unit determines that a disconnection has occurred at one of the first and second current transformers when both the first and further determination conditions are satisfied.

4. The protective relay device according to claim 2, wherein the disconnection detection unit further includes a flip-flop for holding a determination result that a disconnection has occurred at one of the first and second current transformers.

5. The protective relay device according to claim 4, wherein the disconnection detection unit further includes:
  a first-additional determination unit configured to determine whether or not a first-additional determination condition that an effective value or an amplitude value of the first alternating current at the present point in time is equal to or greater than a first-additional set value is satisfied; and
  a second-additional determination unit configured to determine whether or not a second-additional determination condition that an effective value or an amplitude value of the second alternating current at the present point in time is equal to or greater than the first-additional set value is satisfied, and the flip-flop resets contents held therein when both the first-additional and second-additional determination conditions are satisfied.

6. The protective relay device according to claim 5, wherein the disconnection detection unit is configured to:
  determine that a disconnection has occurred at the first current transformer when the first-additional determination condition is not satisfied and the second-additional determination condition is satisfied while the flip-flop holds the determination result that a disconnection has occurred at one of the first and second current transformers; and
  determine that a disconnection has occurred at the second current transformer when the first-additional determination condition is satisfied and the second-additional determination condition is not satisfied while the flip-flop holds the determination result that a disconnection has occurred at one of the first and second current transformers.

7. The protective relay device according to claim 2, wherein the disconnection detection unit includes a further determination unit configured to determine whether or not a further determination condition that one of the first amount of difference, the operating quantity at the present point in time, and an effective value or an amplitude value of the first or second alternating current is equal to or greater than a further set value is satisfied, the further set value is greater than the second set value, and the disconnection detection unit does not determine that a disconnection has occurred at the first and second current transformers when the further determination condition is satisfied, even if both the first and second determination conditions are satisfied.

8. The protective relay device according to claim 5, wherein the disconnection detection unit determines that a disconnection has occurred at one of the first and second current transformers when both the first and second determination conditions are satisfied, and only one of the first-additional and second-additional determination conditions is satisfied.

9. The protective relay device according to claim 4, wherein the disconnection detection unit further includes:
  a first-additional determination unit configured to determine whether or not a first-additional determination condition that an effective value or an amplitude value of the first alternating current at the present point in time is equal to or greater than a first-additional set value is satisfied; and
  a second-additional determination unit configured to determine whether or not a second-additional determination condition that the operating quantity at the present point in time is smaller than the first-additional set value is satisfied, and the flip-flop resets contents held therein when both the first-additional and second-additional determination conditions are satisfied.

10. The protective relay device according to claim 9, wherein the disconnection detection unit is configured to:
  determine that a disconnection has occurred at the first current transformer when the first-additional determination condition is not satisfied and the second-additional determination condition is not satisfied while the flip-flop holds the determination result that a disconnection has occurred at one of the first and second current transformers; and
  determine that a disconnection has occurred at the second current transformer when the first-additional determination condition is satisfied and the second-additional determination condition is not satisfied while the flip-flop holds the determination result that a disconnection has occurred at one of the first and second current transformers.

* * * * *